United States Patent [19]

Goodman et al.

[11] 3,858,961

[45] Jan. 7, 1975

[54] PRINTED CIRCUIT BOARD CONNECTOR

[75] Inventors: David S. Goodman, Orange; Harold J. Prow, Jr., Costa Mesa, both of Calif.

[73] Assignee: International Telephone and Telegraph Corporation, New York, N.Y.

[22] Filed: June 6, 1973

[21] Appl. No.: 367,519

[52] U.S. Cl. .................... 339/176 MP, 317/101 DH

[51] Int. Cl. .................................................. H01r 3/00

[58] Field of Search .... 339/176 MF, 176 MP, 17 L, 339/17 LM, 17 LC, 19; 317/101 DH

[56] References Cited

UNITED STATES PATENTS

| | | | |
|---|---|---|---|
| 2,904,768 | 9/1959 | Rasmussen | 339/17 LM |
| 3,176,261 | 3/1965 | Greco et al. | 339/17 LM |
| 3,737,838 | 6/1973 | Mattingly, Jr. et al. | 339/176 MP |
| 3,778,753 | 5/1972 | Occhipinti et al. | 339/176 MP |

*Primary Examiner*—David Smith, Jr.
*Attorney, Agent, or Firm*—Thomas L. Peterson

[57] ABSTRACT

A card edge connector for connecting conductive layers on two parallel printed circuit boards without the use of jumper cables. The housing of the connector is formed with a row of pairs of interconnected contact compartments. Unitary contacts are mounted in each pair of compartments through openings formed in the bottom of the housing. The unitary contacts are formed with spring contacting elements which are positioned in printed circuit board receiving slots that open through the top of the housing. Lips are formed on the upper portion of the housing which engage the upper free ends of the contact elements to hold them in a preloaded condition.

3 Claims, 4 Drawing Figures

PRINTED CIRCUIT BOARD CONNECTOR

BACKGROUND OF THE INVENTION

The present invention relates generally to a printed circuit board connector and, more specifically, to a card edge connector for interconnecting conductive layers on printed circuit boards mounted in parallel relationship.

Printed circuit board connectors are well known in the art for mounting the edges of printed circuit boards mounted in parallel relationship on planar mounting plates. Such connectors are generally referred to as card edge connectors. A connector of this type is disclosed in U.S. Pat. No. 3,395,377, for example. This patent discloses a unitary molded housing having a plurality of parallel printed circuit board receiving slots formed therein. Contacts are positioned in compartments extending along the slots. The contacts engage conductive layers formed on printed circuit boards which are mounted in parallel relationship in the various slots. Sometimes it is desired to provide an electrical connection between conductive layers of different printed circuit boards mounted in the connector. Typically, this has been accomplished by the use of jumper cables which are connected to tails of the contacts that extend through the bottom of the connector housing and the mounting plate.

The present technique of using jumper cables for interconnecting the conductive layers of printed circuit boards mounted in card edge connectors has the disadvantage of being relatively expensive, requiring a substantial amount of space and increasing the resistance of the interconnection joints. The purpose of the present invention is to overcome the attendant disadvantages of the aforementioned technique by providing a contact arrangement within a card edge connector which eliminates the need of a jumper cable and protects the contacts from damage as the result of insertion of printed circuit boards in the connector.

SUMMARY OF THE INVENTION

According to the principal aspect of the present invention, there is provided a card edge connector comprising an insulated housing having a pair of rows of contact compartments therein. The compartments in the respective rows are aligned with each other. The aligned compartments are in communication with each other adjacent their lower portions to provide a plurality of interconnected pairs of compartments. Openings are formed in the bottom of the housing in communication with each interconnected pair of compartments. Printed circuit board receiving slots are formed in the top of the housing above each row of compartments. Unitary contacts are inserted into the interconnected pairs of compartments through the openings in the bottom of the housing. Each unitary contact is formed with a spring element which is positioned in a respective compartment of the interconnected pair of compartments to engage conductive layers on boards inserted into said slots. Because the contacts have a unitary construction, the contacts will form "jumpers" between conductive layers on printed circuit boards inserted in the two slots formed in the housing. Because the contacts are inserted into the contact compartments through the openings formed in the bottom of the housing, the upper portion of the housing may be formed to extend over the free ends of the spring elements of the contacts to protect the contacts from damage during insertion of the printed circuit boards into the slots in the housing. In addition, such upper portion of the housing provides slanted surfaces which cooperate with the spring elements of the contacts to preload the same.

Other aspects and advantages of the invention will become more apparent from the following description taken in connection with the accompanying drawings.

DESCRIPTION OF THE PREFERRED EMBODIMENT

Figures 1, 2, 4:
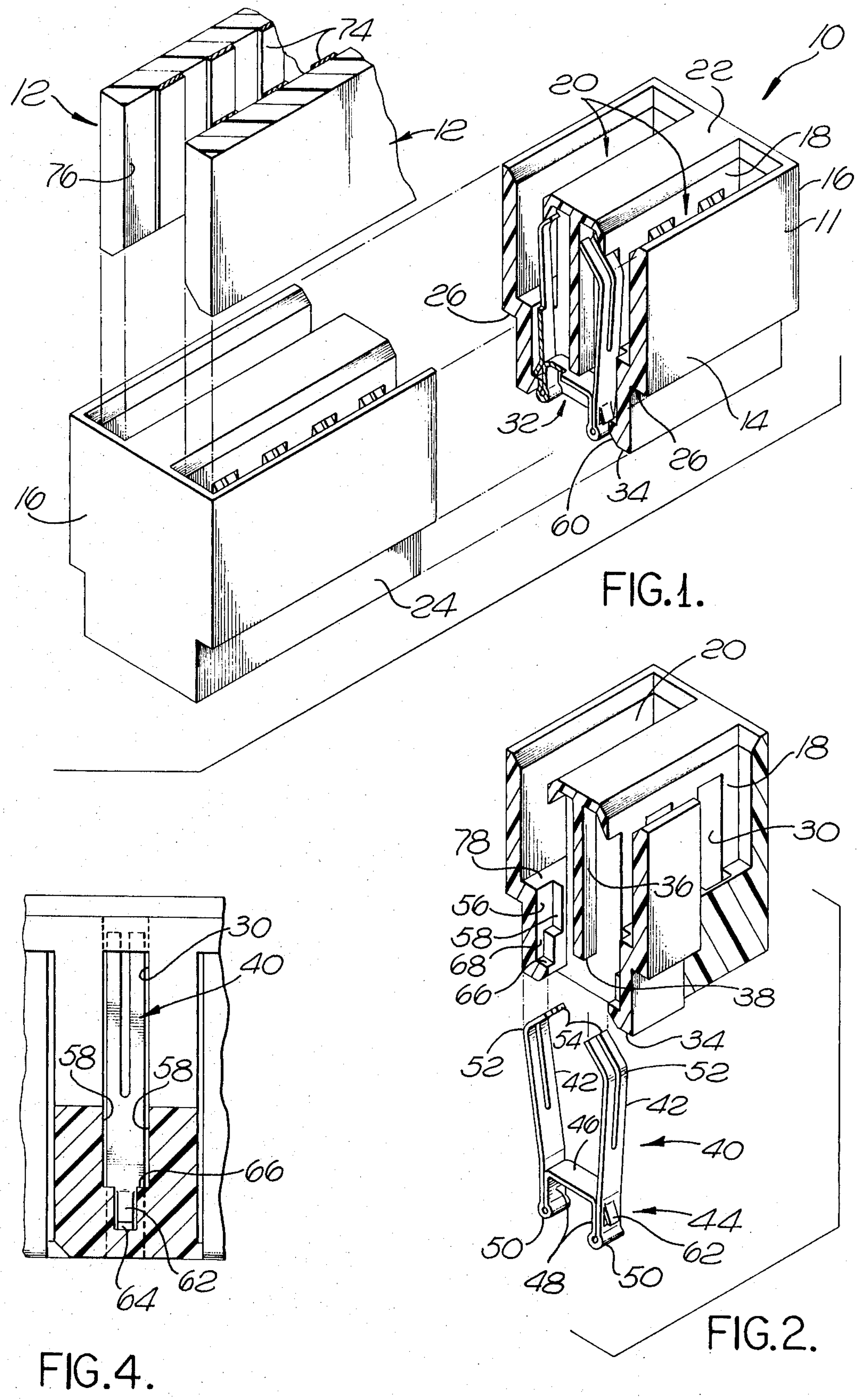
FIG. 1 is a perspective view illustrating the edge board connector of the present invention with portions broken away to illustrate the interior structure thereof and with two printed circuit boards positioned to be inserted into the connector.
FIG. 2 is a fragmentary perspective view of one end portion of the connector illustrated in FIG. 1 with a contact located below the connector in a position to be inserted therein and with a portion of the wall of the connector housing removed to show a contact compartment therein.
FIG. 4 is a longitudinal vertical section taken along line 4—4 of FIG. 3.
Figure 3:
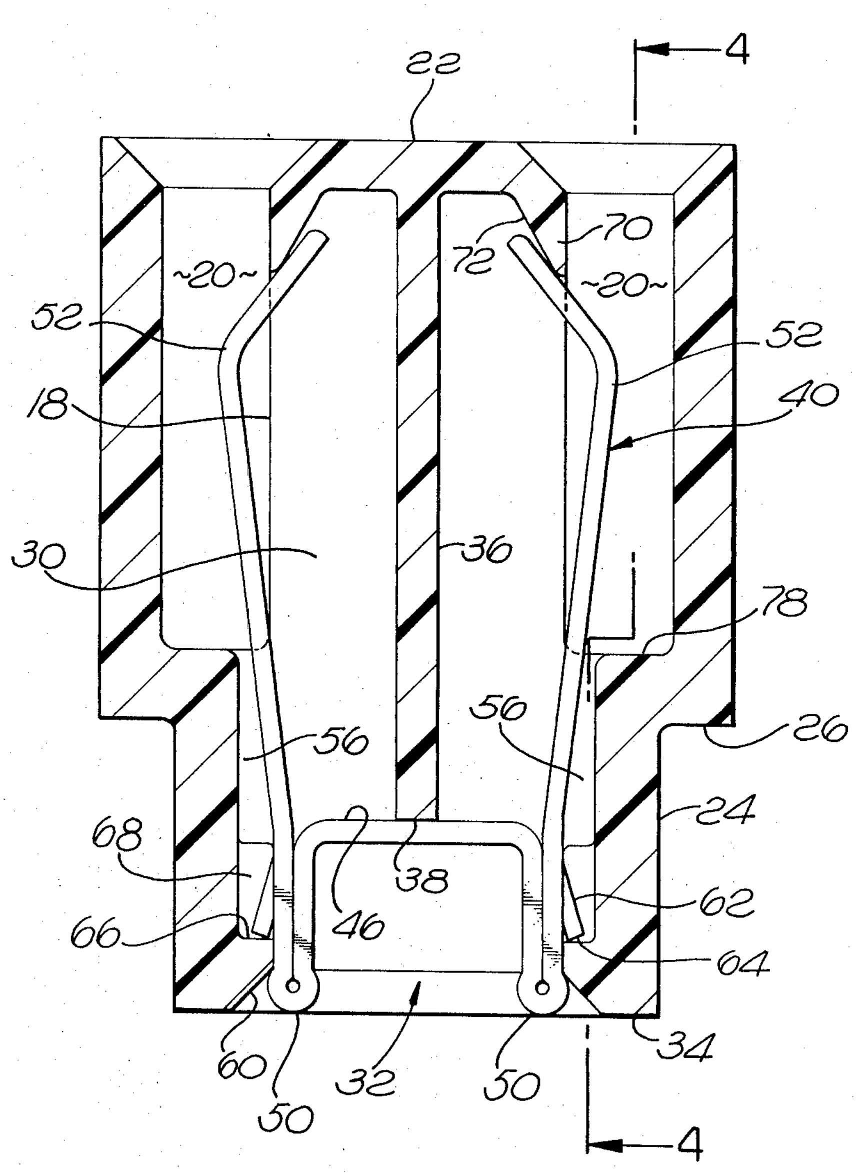
FIG. 3 is a partial transverse sectional view taken through a pair of adjacent contact compartments in the connector of the invention.

Referring now to FIG. 1 in detail, there is shown the edge board connector of the present invention, generally designated 10, which is used to interconnect a pair of printed circuit boards 12. The housing 11 of the connector is an elongated unitary plastic molding comprising side walls 14, end walls 16 and a longitudinally extending vertical intermediate wall 18 spaced from the side walls 14 to define two parallel vertically extending slots 20. The slots 20 open through the top portion 22 of the housing member 11 and are adapted to receive the lower edges of the printed circuit boards 12.

The lower portion 24 of the housing 11 has a width less than the distance between the exterior of the walls 18, thereby defining a pair of downwardly facing shoulders 26. The connector may be mounted on a planar mounting board (not shown) which has a rectangular opening therein which is complementary to the lower portion 24 of the housing member 11. Alternatively, the upper portions of the printed circuit boards 12 may be inserted into edge board connectors on a backpanel (not shown) and the connector 10 engaged with the exposed edges of the boards 12.

Two rows of longitudinally spaced vertical recesses 30 are formed along the intermediate wall 18 of the housing member 11. Each recess constitutes a contact compartment which faces a corresponding slot 20. The longitudinally aligned adjacent pairs of contact compartments on opposite sides of the intermediate wall 18 are interconnected at their lower ends by openings 32 which extend upwardly through the bottom 34 of the housing 11. The intermediate wall 18 is formed with narrow vertical partitions 36 which separate the upper portions of the aligned compartments 30. The bottom 38 of each partition 36 is positioned above the bottom 34 of the housing member.

A unitary contact 40 is mounted in each pair of interconnected compartments 30. Each contact includes upstanding spring sections 42 which are disposed in corresponding compartments 30 and a mounting portion 44 which is mounted below the bottom 38 of the partition 36. The mounting portion 44 includes a horizontally extending cross member 46 and two downwardly bent legs 48 which join the lower portions of the spring sections 42 by bights or bends 50. The spring sections 42 may be of the bifurcated cantilever type, as shown, or non-bifurcated. The spring sections of the contact extend upwardly from the mounting portion 44 at an angle away from each other to convex contacting portions 52 and are reversely bent toward each other at their free ends 54.

The contact 40 is a unitary item and is formed by a stamping and bending process from a single strip of spring metal. Substantially any resilient metal having good electrical conductivity can be used for the contact of this invention. One such metal is a phosphor bronze plated with nickel and then gold or silver. Another resilient metal which may be used is a beryllium-copper alloy.

The spring sections 42 of the contact are sufficiently resilient so that they may be deflected toward one another to allow the contact to be inserted upwardly into an interconnected pair of compartments 30 through the corresponding opening 32 in the bottom of the housing. The width of the mounting portion 44 of the contact 40 is slightly less than the lateral dimension of the opening 32 so that the mounting portion will be firmly seated in the housing when the contact is fully positioned therein. It will be seen that upward movement of the contact into the housing is limited by the engagement of the cross member 46 on the contact with the bottom 38 of the partition 36. After the contact is fully mounted in the interconnected compartments 30, the spring sections 42 will spring outwardly whereupon the lower portions of the spring sections will slide into vertical recesses 56 formed on the inside of the side walls 14 of the lower narrow section 24 of the housing. The width of the recesses 56 is only slightly greater than the width of the spring sections 42 of the contact so that the contact will be properly vertically positioned in the compartments 30 by the engagement of the edges of the spring sections with the side walls 58 of the recess 56.

It will be noted that the openings 32 are chamfered adjacent the bottom 34 of the housing member, as indicated at 60, to facilitate entry of the free end portions 54 of the contacts into the compartments 30 and also to provide a clearance space for the enlarged bight sections 50 at the lower ends of the mounting portion of the contact.

The contact is retained in the pair of compartments 30 by means of downwardly and outwardly extending spring tabs 62 which are cut out from the lower portions of the spring sections 42 of the contacts. The lower ends 64 of these tabs engage the bottoms 66 of vertical slots 68 formed in the side walls 14 of the housing below the recesses 56. The slots 68 are just wide enough to allow the tabs to be slidably received therein. The distance between the bottoms 66 of the slots 68 and the bottom 38 of the partition 36 is slightly greater than the distance between the top of the cross member 46 of the contact and the bottoms 64 of the tabs 62. It will be appreciated that when a contact 40 is inserted through an opening 32 in the bottom of the connector housing and moved upwardly into a pair of compartments 30, the tabs 62 will engage the chamfered edges 60 of the opening whereby the tabs will deflect inwardly. Upon passing the bottoms 66 of the slots 68, the tabs will spring outwardly into the slots. Engagement of the cross member 46 with the partition 36 limits upward movement of the contact into the compartments 30, and the engagement of the bottoms 64 of the tabs 62 of the contact with the bottoms 66 of the slots 68 limit downward movement of the contact in the housing.

The contact 40 may be removed from the housing 11 by simultaneously inserting suitable tools, not shown, downwardly through the slots 20 between the outer surfaces of the contact spring sections 42 and the rear surfaces of the recesses 56 and slots 68 to deflect the tabs 62 inwardly. By so deflecting the tabs, the bottoms 64 thereof will retract from the bottoms 66 of the slots 68 thereby allowing the contact to be withdrawn from the housing through the bottom opening 32.

When the printed circuit boards 12 are not mounted in the slots 20 in the connector 10, the contacting portions 52 of the contact 40 extend into the slots. The upper portion of the intermediate wall 18 of the connector is formed with outwardly and downwardly extending lips 70 which have inner surfaces 72 that extend at a slight acute angle with respect to the bent free end portions 54 of the contact spring sections 42. When a contact is inserted into a pair of compartments 30, the free end portions 54 of the contact will engage the inclined surfaces 72 on the lips 70 thereby deflecting the spring sections 42 of the contact inwardly into the recesses 30 whereby such spring sections are held in a preloaded condition.

When the printed circuit boards 12 are inserted into the slots 20 in the connector 10, conductive layers 74 on the facing surfaces 76 of the boards will engage the contacting portions 52 of each contact 40. Since such contacting portions are integral parts of the unitary contact 40, an electrical connection will be provided between adjacent conductive layers 74 on the printed circuit boards 12. Upwardly facing elongated ledges 78 are formed on the inner surface of the outer walls 14 at the transition of the lower section 24 with the upper section of the housing. Such ledges 78 limit the downward movement of the printed circuit boards 12 in the slots 20.

From the foregoing, it will be appreciated that by the present invention there is provided a low cost and simple card edge connector which allows interconnection of conductive layers on parallel printed circuit boards without the requirement of jumper cables. Because the contacts 40 are inserted into the contact compartments in the connector through openings in the bottom thereof, the upper free end portions 54 of the respective spring sections of each contact may be disposed under a lip 70 which protects the spring sections from damage which might otherwise occur when a printed circuit board is inserted into the slots 20. Also, by this arrangement the spring sections 42 of the contacts are preloaded simultaneously upon the mounting of the contacts in the compartments 30.

What is claimed is:

1. A printed circuit board connector comprising:

an insulated housing member having a pair of rows of contact compartments therein, the compartments in said rows being longitudinally aligned with each other with the aligned compartments being in communication with each other adjacent their lower portions to provide a plurality of interconnected pairs of said compartments;

a pair of printed circuit board receiving slots formed in said housing member opening at the top thereof and each communicating with a corresponding one of said rows of compartments;

openings extending through the bottom of said housing communicating with each of said interconnected pairs of compartments;

a unitary contact positioned in each of said interconnected pairs of said compartments and insertable therein through a corresponding one of said openings, each said contact being formed with a pair of spring contacting portions each positioned in a respective compartment of said interconnected pair of compartments, said spring contacting portions extending into said slots to engage conductive layers on printed circuit boards inserted into said slots whereby said layers are electrically interconnected by said contact; and each said contact is formed with a downwardly and outwardly extending integral spring tab lying below its corresponding slot, the lower end of said tab engaging an upwardly facing shoulder formed on said housing member to releasably retain said contact in said interconnected pair of compartments whereby said contact may be removed from said compartments through the corresponding opening thereof.

2. A printed circuit board connector comprising:

an insulated housing member having a pair of rows of contact compartments therein, the compartments in said rows being longitudinally aligned with each other with the aligned compartments being in communication with each other adjacent their lower portions to provide a plurality of interconnected pairs of said compartments;

a pair of printed circuit board receiving slots formed in said housing member opening at the top thereof and each communicating with a corresponding one of said rows of compartments;

openings extending through the bottom of said housing communicating with each of said interconnected pairs of compartments;

a unitary contact positioned in each of said interconnected pairs of said compartments and insertable therein through a corresponding one of said openings, each said contact being formed with a pair of spring contacting portions each positioned in a respective compartment of said interconnected pair of compartments, said spring contacting portions extending into said slots to engage conductive layers on printed circuit boards inserted into said slots whereby said layers are electrically interconnected by said contact; and each said unitary contact comprises a spring metal strip formed with a generally horizontally extending cross member, downwardly bent legs on the ends of said cross member, and upstanding spring sections joined at their lower ends to the lower ends of said legs by bights, said upstanding spring sections embodying said contacting portions of said contacts.

3. A connector as set forth in claim 2 wherein:

the lower portion of each said upstanding spring section is formed with a downwardly and outwardly extending integral spring tab, the lower end of said tab engaging an upwardly facing shoulder formed on said housing member to releasably retain said contact in said interconnected pair of compartments whereby said contact may be removed from said compartments through the corresponding opening thereof.

* * * * *